United States Patent
Schmitz et al.

(10) Patent No.: US 6,828,658 B2
(45) Date of Patent: Dec. 7, 2004

(54) PACKAGE FOR INTEGRATED CIRCUIT WITH INTERNAL MATCHING

(75) Inventors: Norbert A. Schmitz, Roanoke, VA (US); Richard J. Giacchino, Peabody, MA (US); Wayne Struble, Franklin, MA (US)

(73) Assignee: M/A-Com, Inc., Lowell, MA (US)

( * ) Notice: Subject to any disclaimer, the term of this patent is extended or adjusted under 35 U.S.C. 154(b) by 105 days.

(21) Appl. No.: 10/142,250

(22) Filed: May 9, 2002

(65) Prior Publication Data

US 2003/0209784 A1 Nov. 13, 2003

(51) Int. Cl.$^7$ .............................................. H01L 39/00
(52) U.S. Cl. ...................... 257/662; 257/663; 257/664; 257/665
(58) Field of Search ................................. 257/662–665

(56) References Cited

U.S. PATENT DOCUMENTS

| | | | |
|---|---|---|---|
| 4,353,047 A | | 10/1982 | Noguchi et al. |
| 5,557,144 A | * | 9/1996 | Rosenstock et al. ........ 257/668 |
| 5,696,466 A | | 12/1997 | Li |
| 5,963,089 A | | 10/1999 | Kusunoki |
| 6,016,084 A | | 1/2000 | Sugimoto |
| 6,049,126 A | | 4/2000 | Saitoh |
| 6,084,300 A | * | 7/2000 | Oka ............................ 257/730 |
| 6,188,237 B1 | | 2/2001 | Suzuki et al. |
| 6,289,204 B1 | | 9/2001 | Estes et al. |
| 6,392,298 B1 | | 5/2002 | Leighton et al. |
| 6,456,125 B1 | | 9/2002 | Miyazawa |
| 6,528,879 B2 | * | 3/2003 | Sakamoto et al. .......... 257/729 |

* cited by examiner

*Primary Examiner*—Luan Thai

(57) ABSTRACT

An integrated circuit package houses and connects to a die to form an integrated circuit with internal matching. The package comprises a lead frame comprising at least one transmission line, a die paddle, and at least one input lead and at least one output lead. Bond wires connect select locations along the at least one transmission line to ground through impedance matching circuit components located within the integrated circuit to provide an impedance matching network associated with at least one of the output leads. A plastic mold compound substantially encases the lead frame, while exposing the die paddle and the input/output leads. Incorporating the transmission line into the leadframe avoids having to place the matching network outside of the integrated circuit package. That is, etching the lead frame to provide the transmission line, and placing components (e.g., capacitors, inductors, etc.) of the impedance transform matching circuit within the integrated circuit and connecting the components between select locations on the transmission line and ground is relatively inexpensive.

16 Claims, 6 Drawing Sheets

PACKAGE FOR INTEGRATED CIRCUIT WITH INTERNAL MATCHING

BACKGROUND OF THE INVENTION

The present invention relates to the field of semiconductor devices, and in particular to an integrated circuit with internal impedance matching In cellular telephones, radio frequency (RF) power amplifiers (PA) are built using a semiconductor device (e.g., silicon or GaAs) that has a low output impedance (e.g., less two ohms). This impedance needs to be transformed to a higher impedance value (e.g., fifty ohms) to connect to filters, switches, diplexers and antennas in the rest of the radio. This impedance transformation network is typically referred to as the "output match."

In addition to transforming a two-ohm impedance to fifty ohms, the output match is typically tuned at the harmonic frequencies to increase efficiency and battery life (e.g., talk time) of the cellular telephone. These harmonic frequencies extend up to 6 GHz. At these frequencies, the distance between the capacitors and other passive components used to construct the output match is critical, for example a distance of 0.001" is significant. For example, a vendor may specify distances of 0.062" and 0.416" in one one-thousandth of an inch of precision between the capacitors and other passive components of the output matching network.

The harmonic frequencies present a second problem. The capacitors have parasitic values that become significant at the harmonic frequencies. Since the parasitic values differ from one manufacturer to another, changing vendors for the same value component will yield different results.

In producing high volumes (e.g., 30,000,000 per year) these dependencies on a single vendor and tolerances of 0.001" are costly to manage. Therefore, there is a need for an improved technique for providing an impedance matching network.

SUMMARY OF THE INVENTION

Briefly, according to an aspect of the present invention, an integrated circuit includes a die that is electrically connected to and housed within a plastic package. The package includes a lead frame comprising a transmission line, at least one input signal lead, and at least one output signal lead that is connected to the transmission line. The die provides an output signal onto the transmission line. At least one select location along the transmission line is connected to a first electrical node through an impedance matching circuit within the integrated circuit.

According to another aspect of the present invention, an integrated circuit package includes a lead frame comprising at least one transmission line, at least one input signal lead, and at least one output signal lead. At least one select location along the transmission line is connected to a first electrical node through an impedance matching circuit within the integrated circuit package, wherein the impedance matching circuit is associated with the output signal lead.

The impedance matching circuit is located within the integrated circuit. For example, in one embodiment, the impedance matching circuit may be connected between the at least one select location along the transmission line and a die paddle of the lead frame. In another embodiment, the impedance matching circuit may be located within the die, and electrically connected (e.g., by bond wires) to the at least one select location along the transmission line.

In one embodiment, at least one select location along the transmission line is wire bonded to a capacitor. The capacitance value of the capacitor and the dimensions of the transmission line are selected to provide the desired matching circuit (i.e., output impedance).

Incorporating the transmission line into the lead frame avoids having to place the matching network outside of the integrated circuit. For example, etching the lead frame to provide the transmission line, and placing components (e.g., capacitors, inductors, etc.) of the impedance transform matching circuit on a die and connecting these components on the die between select locations on the transmission line and the first electrical node (e.g., ground) is relatively inexpensive. A second embodiment of placing the impedance matching circuit between the at least one select location along the transmission line and the die paddle is also relatively inexpensive.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
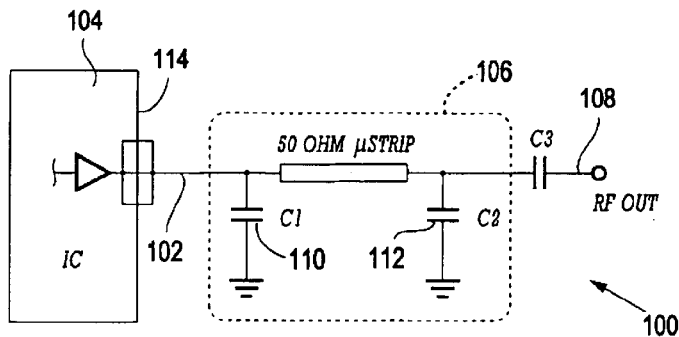
FIG. 1 illustrates a functional block diagram of a prior art matching circuit configuration for an RF output signal.

FIG. 1 illustrates a functional block diagram of a prior art matching circuit configuration 100 that provides an output signal on a line 102. In one embodiment, the output signal on the line 102 is from an RF power amplifier (PA) within an integrated circuit 104. The integrated circuit 104 provides the output signal on the line 102 to an impedance transformation network 106 (also referred to herein as a "matching network"), which provides an impedance matched output signal on a line 108. For example, the impedance matched output signal on the line 108 may for example have an output impedance of fifty ohms, whereas the impedance of the signal on the line 102 may for example be two ohms. The impedance matching network 106 includes a plurality of capacitors $C_1$ 110 and $C_2$ 112 that are precisely positioned to provide the required impedance transformation and harmonic filtering. For example, the capacitor $C_1$ 110 is precisely positioned (e.g., to a 0.001" tolerance) from edge 114 of the integrated circuit 104, while the distance between capacitors $C_1$ 110 and $C_2$ 112 is also precisely controlled. As set forth above, these positioning constraints lead to a problematic and relatively costly matching network that is external to the integrated circuit 104.

Figure 2:
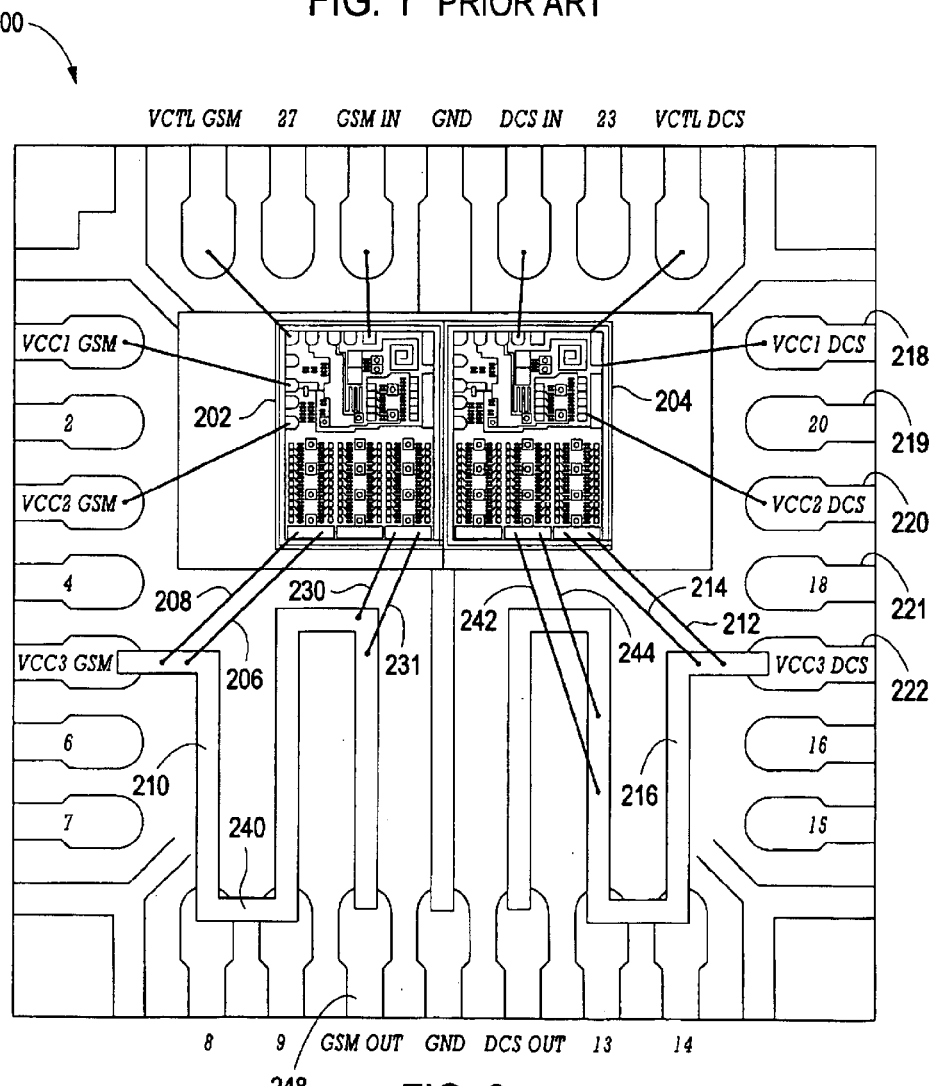
FIG. 2 is a cut-a-way top view of a first integrated circuit that includes a first die, and a second die within a first plastic package.

FIG. 2 is a cut-a-way top view of a first integrated circuit 200 that includes a first die 202, and a second die 204 within a plastic package. The first die 202 provides an output signal via bond wires 206, 208 to a first transmission line 210 located on a lead frame (e.g., etched copper). The second die 204 provides an output signal via bond wires 212, 214 to a second transmission line 216 located on the lead frame. The lead frame also includes a plurality of input/output (I/O) leads (e.g., 218–222). Bond wires interconnect bonding pads on the dies and the I/O leads. According to an aspect of the present invention, the lead frame also includes at least one transmission line (e.g., 0.1 mm thick in non-exposed areas, and 0.2 mm thick in exposed areas) that cooperates with circuit components within the integrated circuit to provide an integrated circuit with internal matching. Specifically, in this embodiment matching circuit components such as capacitors and/or inductors (not shown) located on the first die 202 are connected to the first transmission line 210. For example, a first capacitor located on the first die 202 is connected to a first selected location on the transmission line 210 by bond wires 230, 231. Two bond wires are shown in this embodiment for current handling. However, a skilled person will recognize of course that more or less bond wires may be used to connect the matching circuit component on the die to the transmission line, depending upon the current handling required. In addition, a second capacitor (now shown) may be located on the die 202 and connected to a second location (e.g., location 240) on the transmission line 210 by bond wires (not shown) to provide a matching circuit that is functionally similar to the circuit 106 illustrated in FIG. 1. However, in the embodiment of FIG. 2, the matching network is located within the integrated circuit. That is, the integrated circuit of FIG. 2 includes internal matching.

The second die 204 may also include an internal matching network that is established by connecting a matching circuit component(s) within the second die 204, to the transmission line 216 for example via bond wires 242, 244.

Figure 3:
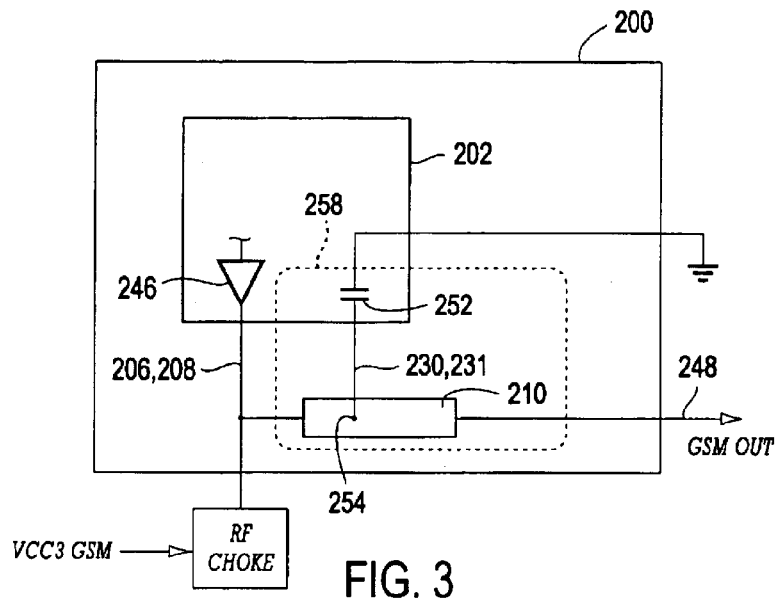
FIG. 3 is a functional block diagram illustration of the internal matching network associated with the first die illustrated in FIG. 2.

FIG. 3 is a functional block diagram illustration of the internal matching network associated with the first die 202 illustrated in FIG. 2. For example an output amplifier 246 located on the die 202 provides an output signal that is conducted by the transmission line 210 to an I/O lead 248. A first lead of a capacitor 252 located on the die 202 is connected to a first select location 254 on the transmission line 210 via the bond wires 230, 231. A second lead of the capacitor 252 is connected to a first electrical potential, for example ground. Significantly, this provides an impedance matching circuit 258 that is located within the integrated circuit 200.

Figures 4, 5:
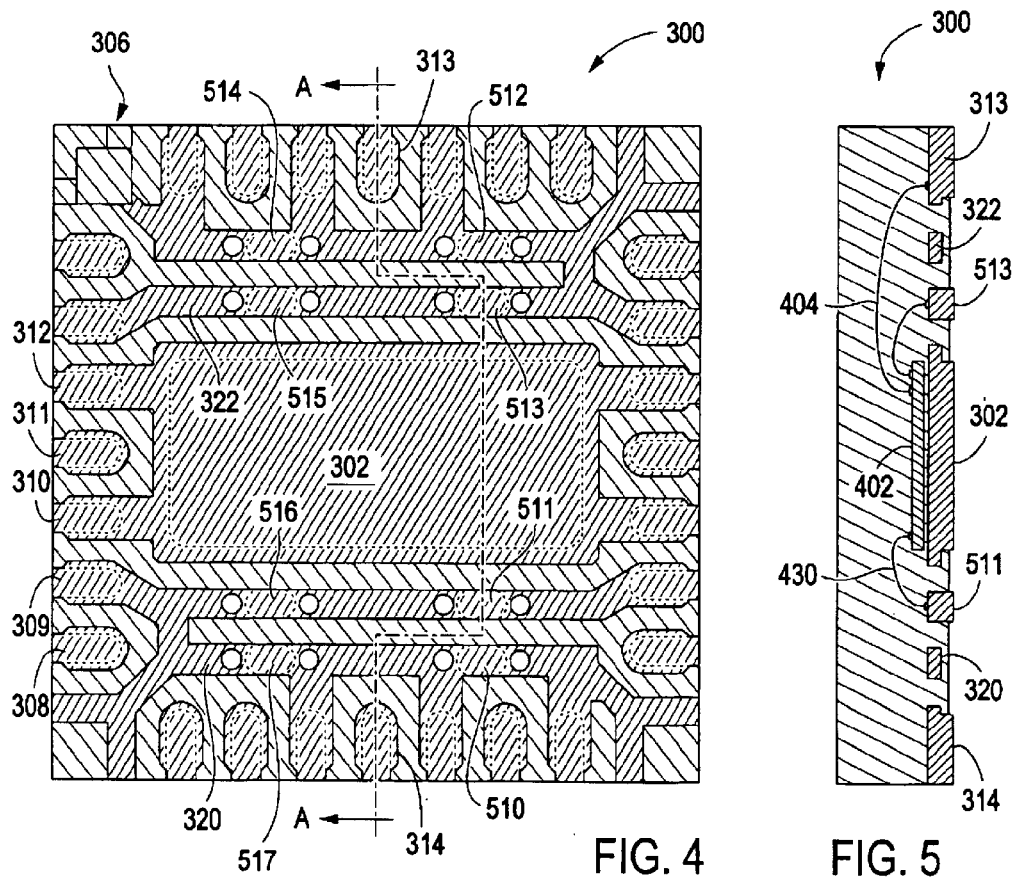
FIG. 4 is a cut-a-way top view of a lead frame of a second integrated circuit that provides at least one output signal.
FIG. 5 illustrates a section taken along line A—A in FIG. 4.

FIG. 4 is a cut-a-way top view of a second integrated circuit 300 that includes a die (not shown in FIG. 4), that is placed onto a die paddle 302 of a lead frame 306 (e.g., etched copper) that includes plurality of I/O leads (e.g., 308–314). Interconnect bonding pads located on the die are connected for example via bond wires to the I/O leads. The lead frame 306 also includes a first transmission line 320 shown in cross hatch. In this embodiment, the package also includes a second transmission line 322 that is also not exposed on the exterior of the package. The first transmission line 320 is associated with a first output signal from the package, while the second transmission line is associated with a second output signal from the package. Matching circuit components such as capacitors and/or inductors (not shown) located on the die and associated with the first output signal, are connected between a first electrical potential (e.g., ground) and at least one select location on the first transmission line 320.

Figure 6:
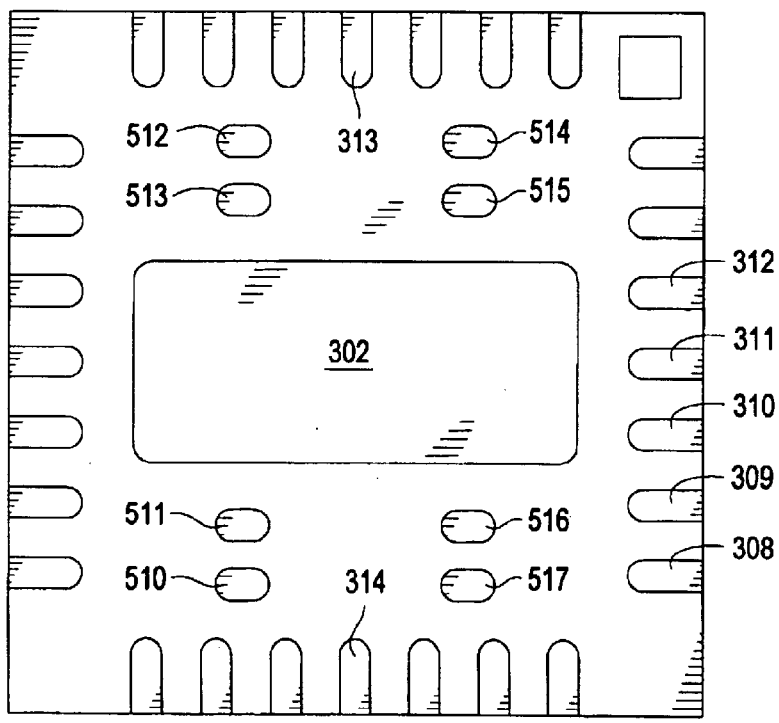
FIG. 6 illustrates a bottom view of the second plastic package of FIG. 4.

FIG. 5 illustrates a section taken along line A—A in FIG. 4. A die 402 is located on the paddle 302, and at least one bond wire 404 connects lead 313 and a bond pad (not shown) on the die 402. FIG. 6 illustrates a bottom view of the second integrated circuit. As shown, the lead frame includes the paddle 302 and the plurality of I/O leads, for example 308–314. Referring to FIGS. 5 and 6, the package also includes a plurality of exposed wire bond support structures 510–517 that represent select locations along the transmission lines at which the matching circuit components may be connected. For example, in one embodiment, these support structures (e.g., etched copper) are connection points for bond wires between the matching components on the die, and the transmission lines within the lead frame of the package. For example, bonding wire 430 (FIG. 5) runs between a matching component (e.g., a capacitor) on the die 402 and the support structure 511 (i.e., a select location on the transmission line 320).

Figure 7:
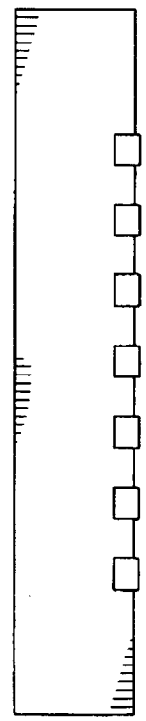
FIG. 7 illustrates a side view of the package of FIG. 6.

FIG. 7 is a side view of the package of FIG. 5.

Figure 8:
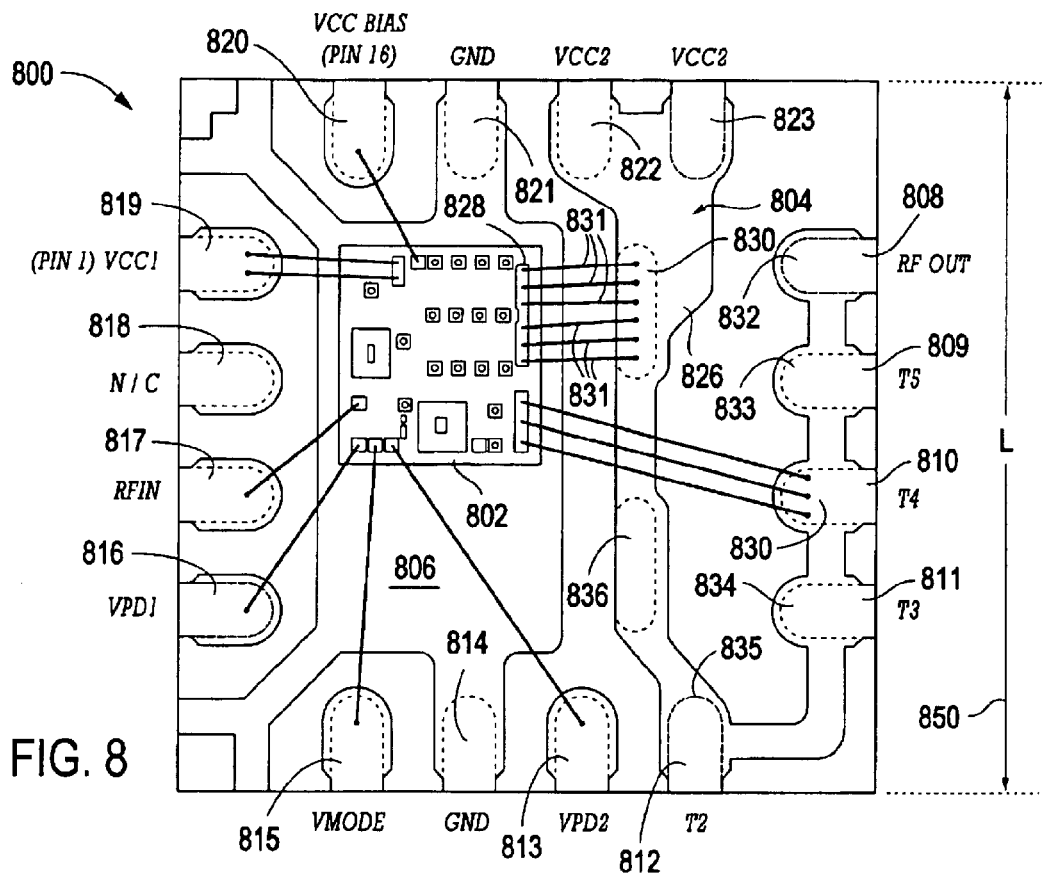
FIG. 8 is a cut-a-way top view of a lead frame of a third integrated circuit that includes an internal matching circuit located within a die.
Figure 9:
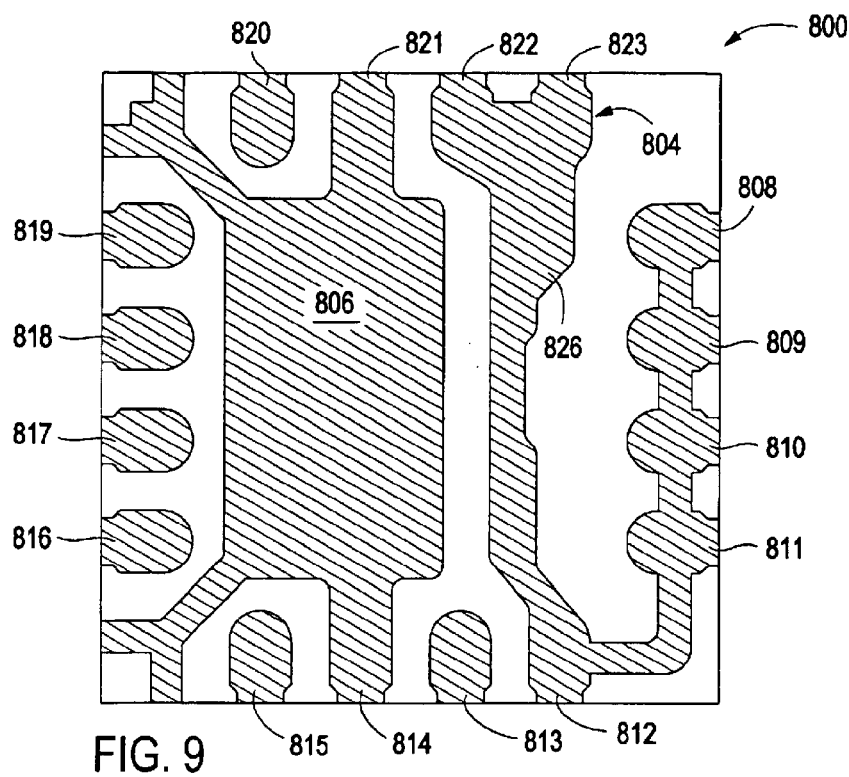
FIG. 9 is a top view of the lead frame of FIG. 8 shown in cross hatch.

FIG. 8 is a cut-a-way top view of a third integrated circuit 800 that includes a die 802, and a lead frame 804 of a third plastic package. FIG. 9 is a top view of the lead frame 804 of FIG. 8 shown in cross hatch. The lead frame 804 includes a die paddle 806 and a plurality of I/O leads 808–823. The lead frame also includes a transmission line 826 that connects an output 828 on the die 802 to selected I/O leads 808–812. In this embodiment, the die output 828 is connected to the transmission line 826 by a plurality of bond wires 831. The die 802 includes at least one component (e.g., a capacitor, inductor, etc) of an impedance matching/transformation network. The network matching component within the die is connected to a first select location 830 along the transmission line 826. As a result, a circuit configuration as shown in FIG. 3 is provided. Depending upon the impedance matching and filtering requirements, the matching circuit component within the die 802 may be connected to the transmission line 826 at one of a plurality of select locations 832–836 along the transmission line, rather than at the selected location 830. In the embodiment of FIG. 8, the integrated circuit 800 is 4 mm×4 mm (i.e., L 850 is equal to 4 cm). As shown in FIG. 8, the path length of the transmission line 826 will vary pending upon the select location (e.g., 830) along the transmission line that the matching circuit component is connected to.

Figure 10:
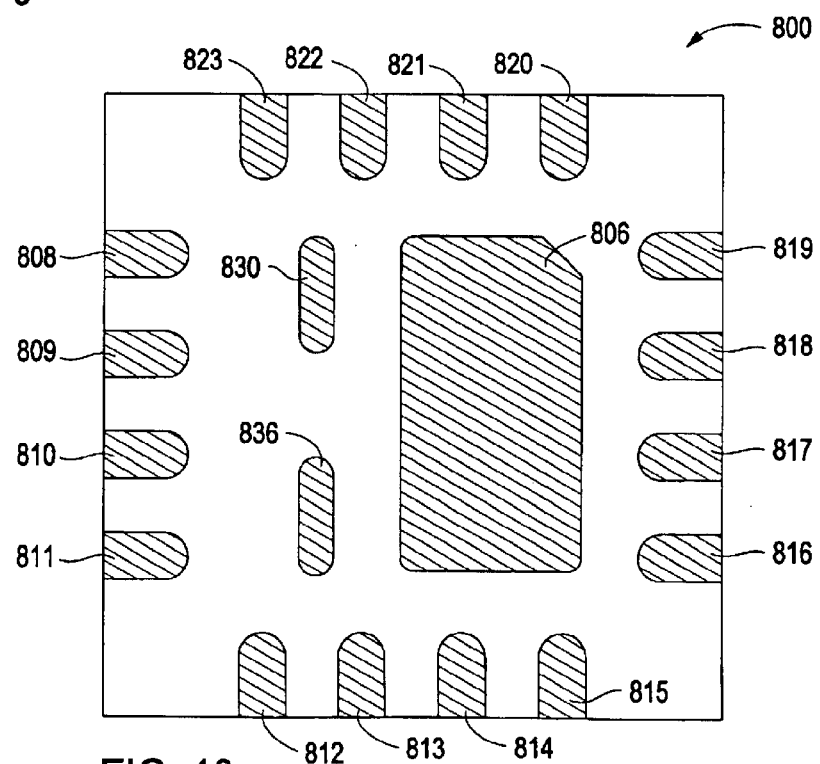
FIG. 10 is a bottom view of the lead frame of FIG. 8 with exposed sections of the lead frame shown in cross hatch.

FIG. 10 is a bottom view of the lead frame of FIG. 8 shown in cross hatch. In this view, support structures associated with the select locations 830, 836 along the transmission line 826 (FIG. 9) are exposed on the underside of the integrated circuit 800.

Figure 11:
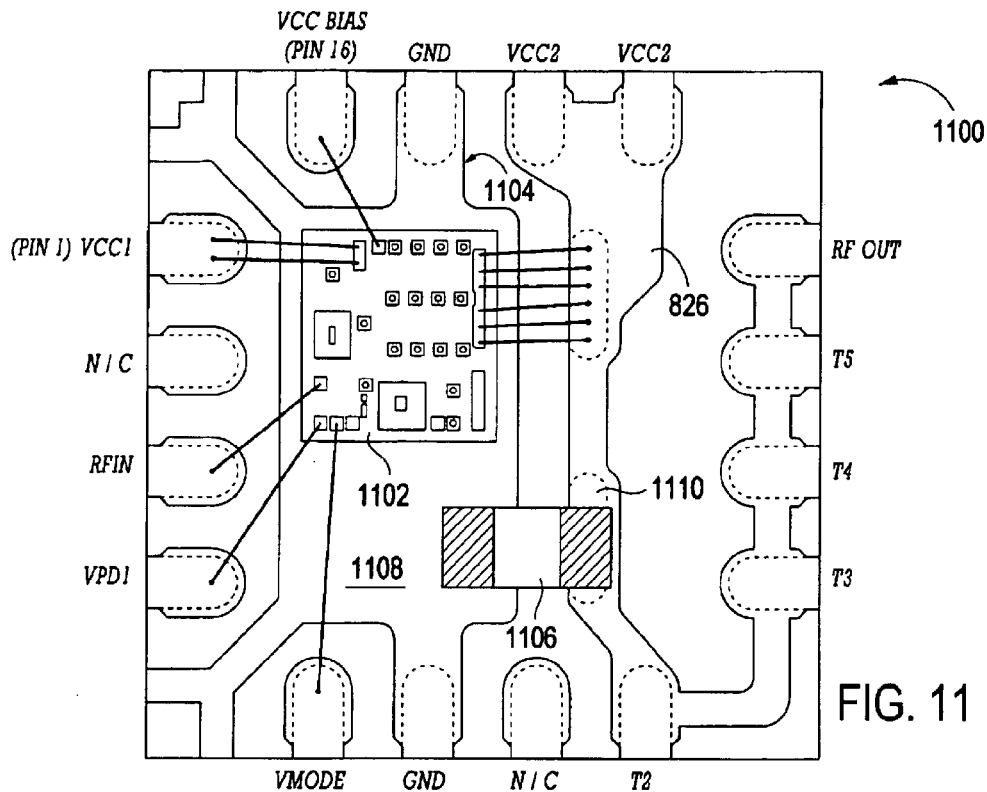
FIG. 11 is a cut-a-way top view of a lead frame of a fourth integrated circuit that includes an internal matching network located between the die paddle and a first select location on the transmission line.

FIG. 11 is a cut-a-way top view of a fourth integrated circuit 1100 that includes a die 1102, and a lead frame 1104 of a fourth plastic package. This embodiment is substantially the same as the embodiment illustrated in FIGS. 8–10, with the principal exception that an internal matching network component 1106 (e.g., a capacitor) is located between die paddle 1108 and a first select location 1110 on the transmission line 826. That is, the internal matching circuit component is not located on the die. However, the internal matching circuit is still resident within the integrated circuit to provide the internal matching.

Figure 12:
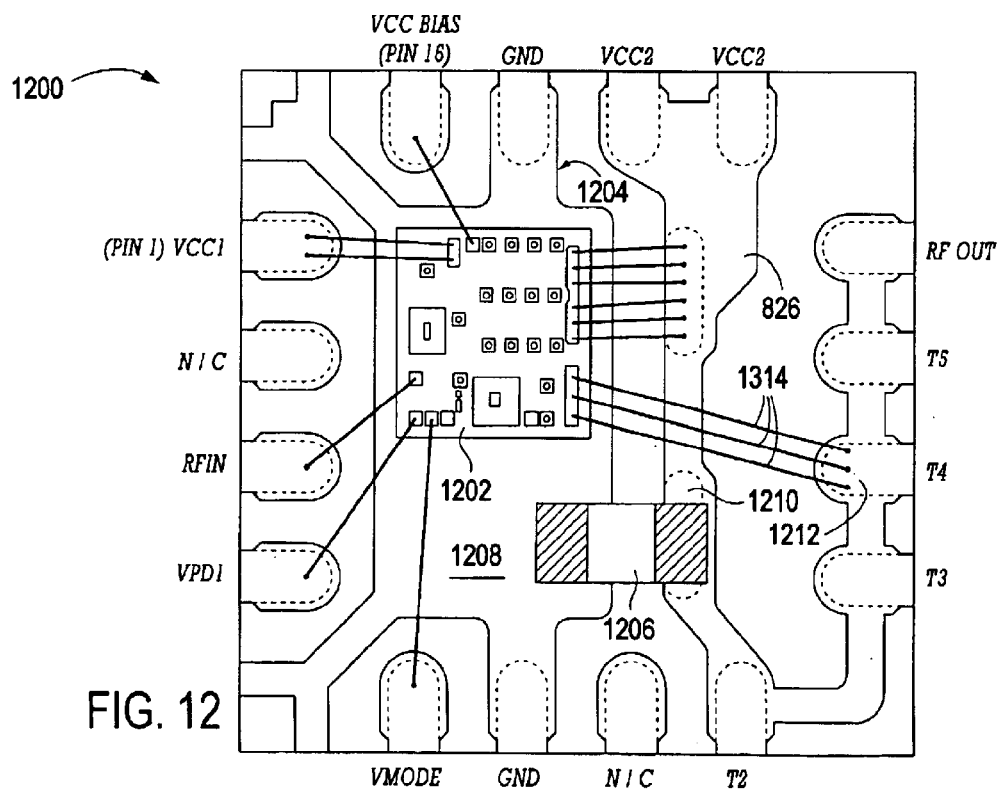
FIG. 12 is a cut-a-way top view of a lead frame of a fifth integrated circuit that includes a first internal matching network component located between the die and a first select location on the transmission line, and a second internal matching network component located between the die paddle and a second select location on the transmission line.

FIG. 12 is a cut-a-way top view of a fifth integrated circuit 1200 that includes a die 1202, and a lead frame 1204 of a fifth plastic package. This embodiment is substantially the same as the embodiments illustrated in FIGS. 8–10, and FIG. 11, with the principal exception that a first internal matching network component 1206 (e.g., a capacitor) is located between a die paddle 1208 and a first select location 1210 on the transmission line 826, and second internal matching network component (not shown) is located within the die 1202 and connected to a second select location 1212 on the transmission line.

Figure 13:
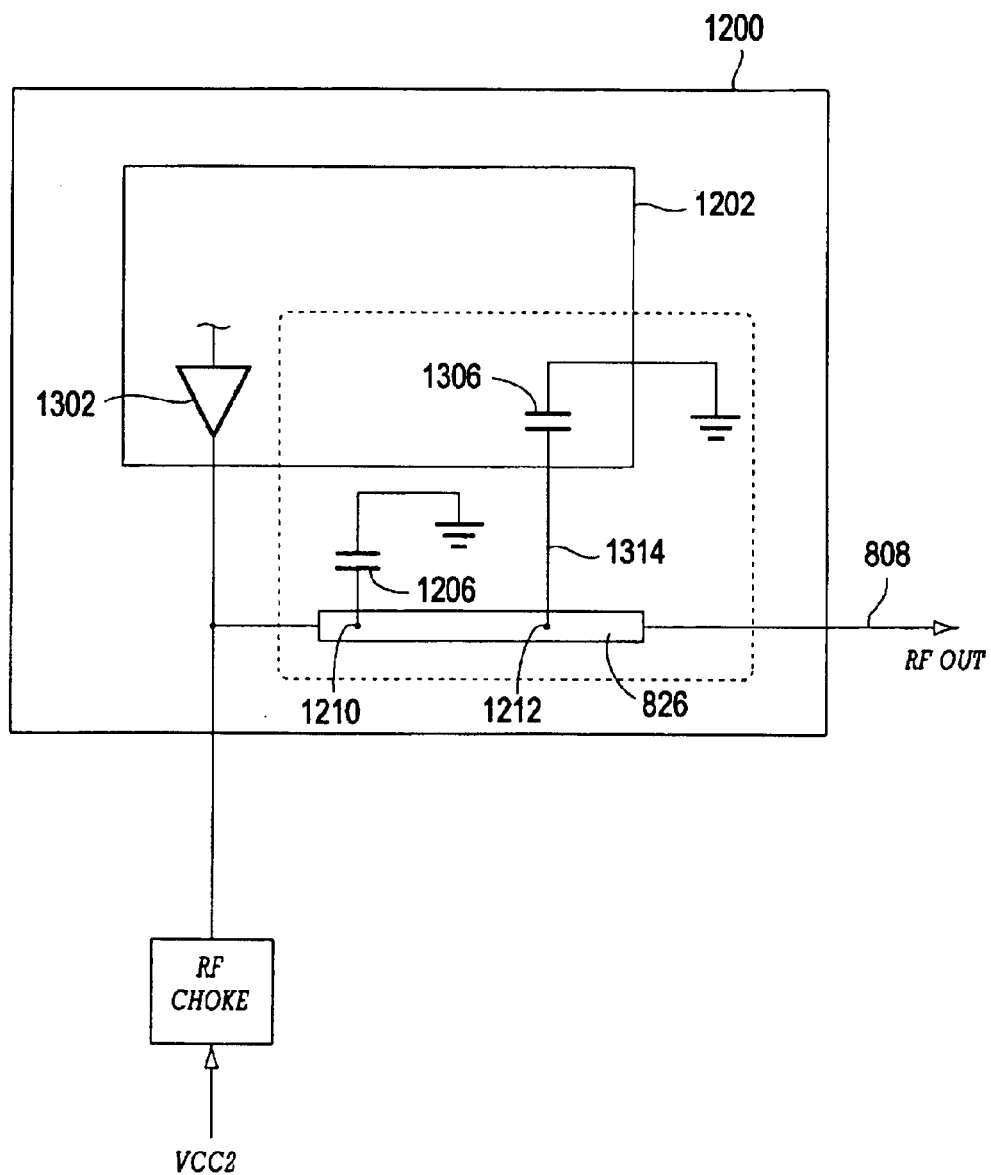
FIG. 13 is a functional block diagram illustration of the internal matching network associated with the integrated circuit of FIG. 12.

FIG. 13 is a functional block diagram illustration of the internal matching network associated with the integrated circuit of FIG. 12. For example, an output amplifier 1302 located on the die 1202 provides an output signal that is conducted by the transmission line 826 to the I/O lead 808. A first lead of a capacitor 1306 located on the die 1202 is connected to the second select location 1212 on the transmission line 826 via bond wires 1314. A second lead of the capacitor 1306 on the die is connected to a first electrical potential, for example ground. A first lead of the capacitor 1206 is connected to the first selected location 1210 on the transmission line 826, while a second lead of the capacitor 1206 is connected to the die paddle (i.e., ground).

Advantageously, the integrated circuit and package of the present invention provide internal impedance matching, thus for example freeing a handset manufacturer (or board manufacturer) from having to provide room on the board for the impedance transformation matching circuitry.

Although the present invention has been discussed in the context of a package for power amplifiers for wireless handsets, it is contemplated that the many other applications will find it desirable to replace applications that require impedance matching, conventionally performed on a circuit board or as lumped element components, with matching circuitry contained within the integrated circuit. Advantageously, this obviates many of the manufacturability problems associated with having to precisely position the components of the matching circuit. In addition, although the matching network components have been connected between the transmission line and ground, the first electrical potential does not necessarily have to be ground.

Although the present invention has been shown and described with respect to several preferred embodiments thereof, various changes, omissions and additions to the form and detail thereof, may be made therein, without departing from the spirit and scope of the invention.

What is claimed is:

1. An internally matched integrated circuit, comprising:
  a package that includes a lead frame comprising at least one input signal lead, at least one output signal lead, and at least one transmission line that is connected to said at least one output signal lead; and
  a die that is electrically connected to and housed within said package, and provides a signal onto said at least one transmission line;
  wherein a select location along said at least one transmission line is electrically connected to a first electrical potential through an impedance matching circuit located on said die.

2. The internally matched integrated circuit of claim 1, wherein said select location along said transmission line and said impedance matching circuit are connected via at least one bond wire.

3. The internally matched integrated circuit of claim 2, wherein said impedance matching circuit comprises a capacitor.

4. The internally matched integrated circuit of claim 2, wherein said impedance matching circuit comprises an inductor.

5. The internally matched integrated circuit of claim 2, wherein said die comprises a GaAs device.

6. The internally matched integrated circuit of claim 2, wherein said die comprises a silicon die.

7. An internally matched integrated circuit, comprising:
  a package that includes a lead frame comprising at least one transmission line, a die paddle, at least one input signal lead, and at least one output signal lead that is connected to said at least one transmission line; and
  a die that is electrically connected to and housed within said package, and provides a signal onto said at least one transmission line;
  wherein at least one select location on said at least one transmission line is electrically connected to said die paddle through an impedance matching circuit.

8. The internally matched integrated circuit of claim 7, wherein said impedance matching circuit comprises a capacitor having a first lead connected to said select location along said transmission line, and a second lead connected to said die paddle.

9. The internally matched integrated circuit of claim 7, wherein said impedance matching circuit comprises an inductor having a first lead connected to said select location along said transmission line, and a second lead connected to said die paddle.

10. The internally matched integrated circuit of claim 7, wherein said impedance matching circuit includes a first lead connected to said select location along said transmission line, and a second lead connected to said die paddle.

11. The internally matched integrated circuit of claim 7, wherein said transmission line has a length of at least one millimeter.

12. An integrated circuit package that houses and electrically connects to a die to form an integrated circuit with internal matching, said package comprising:
  a lead frame comprising a transmission line, a die paddle, a plurality of input leads, and a plurality of output leads at least one which is connected to said transmission line, wherein at least one select location alone said transmission line is electrically connected to a first electrical node through an impedance matching circuit contained within said package to provide an impedance matching network associated with said at least one of said output leads connected to said transmission line: and
  a member that substantially encases said lead frame, while exposing said die paddle and said input leads and said output leads,
  wherein said first electrical node is located on said die paddle, and said impedance matching circuit includes a capacitor having a first lead connected to said die paddle and a second lead connected to said select location on said transmission line.

13. The integrated circuit package of claim 12, wherein said transmission line comprises etched copper.

14. The integrated circuit package of claim 12, wherein said impedance matching circuit comprises a capacitor.

15. The integrated circuit package of claim 12, wherein said impedance matching circuit comprises an inductor.

16. The integrated circuit package of claim 12, wherein said impedance matching circuit is located within the die mounted on said die paddle.

* * * * *